United States Patent
Nordal et al.

(10) Patent No.: US 6,937,499 B2
(45) Date of Patent: Aug. 30, 2005

(54) NON-DESTRUCTIVE READOUT

(76) Inventors: Per-Erik Nordal, Båstadryggen 19, N-1387 Asker (NO); Hans Gude Gudesen, Hans Petters vei 7, N-1639 Gamle Fredrikstad (NO); Geirr I. Leistad, Jongsstubben 19, N-1337 Sandvika (NO)

( * ) Notice: Subject to any disclaimer, the term of this patent is extended or adjusted under 35 U.S.C. 154(b) by 61 days.

(21) Appl. No.: 10/468,888

(22) PCT Filed: Feb. 15, 2002

(86) PCT No.: PCT/NO02/00066

§ 371 (c)(1),
(2), (4) Date: Oct. 1, 2003

(87) PCT Pub. No.: WO02/069340

PCT Pub. Date: Sep. 6, 2002

(65) Prior Publication Data

US 2004/0071018 A1 Apr. 15, 2004

(30) Foreign Application Priority Data

Feb. 26, 2001 (NO) .......................................... 20010968

(51) Int. Cl.$^7$ .............................................. G11C 11/22
(52) U.S. Cl. .................................. 365/145; 365/230.01
(58) Field of Search ............................. 365/145, 230.01

(56) References Cited

U.S. PATENT DOCUMENTS

| | | | | |
|---|---|---|---|---|
| 4,539,661 A | * | 9/1985 | Oritani | .................... 365/233.5 |
| 5,222,047 A | * | 6/1993 | Matsuda et al. | ....... 365/230.03 |
| 5,341,325 A | | 8/1994 | Nakano et al. | |
| 5,530,667 A | | 6/1996 | Omura et al. | |
| 5,666,305 A | | 9/1997 | Mihara et al. | |

FOREIGN PATENT DOCUMENTS

| JP | 5-129622 A | 5/1993 |
|---|---|---|
| JP | 6-275062 A | 9/1994 |

OTHER PUBLICATIONS

High–Speed Board Design Techniques (Introduction to CAD) Dept. of Computer Engineering, Seoul National University, Mar. 5, 1999.

* cited by examiner

Primary Examiner—M. Tran
(74) Attorney, Agent, or Firm—Birch, Stewart, Kolasch, & Birch, LLP.

(57) ABSTRACT

In a method for determining the logic state of memory cells in a passive matrix-addressable data storage device with word and bit lines, components of current response are detected and correlated with a probing voltage, and a time-dependent potential is applied on selected word and bit lines or groups thereof, said potentials being mutually coordinated in magnitude and time such that the resulting voltages across all or some of the non-addressed cells at the crossing points between inactive word lines and active bit lines are brought to contain only negligible voltage components that are temporally correlated with the probing voltage. A first apparatus according to the invention for performing the method provides sequential readout of all memory cells on an active word line (AWL) by means of detection circuits (3; 4). An active word line (AWL) is selected by a multiplexer (7), while inactive word lines (IWL) are clamped to ground during readout. A second apparatus for performing the method is rather similar, but has only a single detection circuit (3, 4). An active word line (AWL) is selected by multiplexer (7) and a bit line (ABL) is selected by a multiplexer (9) provided between one end of the bit lines (BL) and the input of the detection circuit (3, 4), while inactive word and bit lines (IWL; IBL) are clamped to ground during readout.

25 Claims, 11 Drawing Sheets

NON-DESTRUCTIVE READOUT

Figure 1:
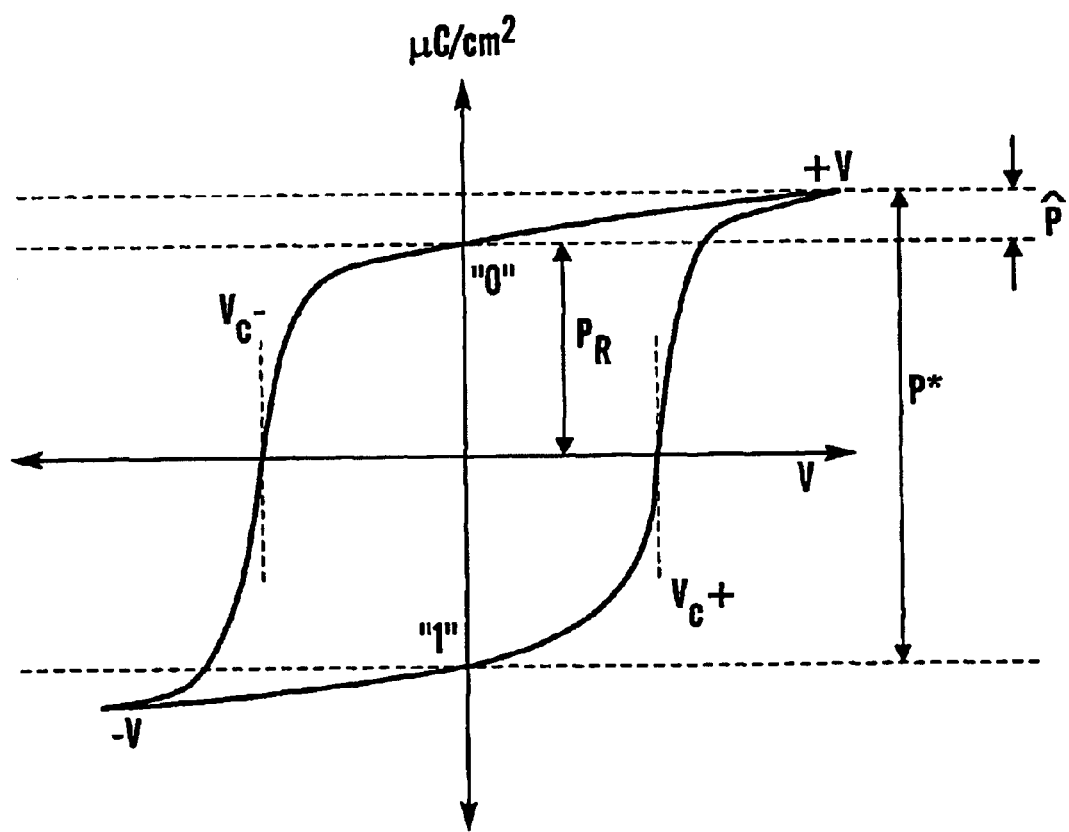

This application is the national phase under 35 U.S.C. §371 of PCT International Application No. PCT/NO02/00066 which has an International filing date of Feb. 15, 2002, which designated the United States of America.

The present invention concerns a method for determining a logic state of selected memory cells provided in a passive matrix-addressable data storage device containing word and bit lines, wherein a specific logic state is assigned a unique logical value according to a predetermined protocol, wherein said cells store data in the form of an electrical polarization state in capacitor-like structures comprising a polarizable material, particularly a ferroelectric or electret material capable of exhibiting hysteresis, wherein said polarizable material is capable of maintaining a non-vanishing electrical polarization in the absence of an externally impressed voltage across said capacitor-like structures, wherein a selection of memory cells takes place by activating the word line or the bit line or both crossing at a memory cell in question, wherein the activation of a word line or a bit line is effected by externally applied potential differences therebetween, thus subjecting said selected cells to a small-signal probing voltage arising from the applied potential difference whereby a current response is generated from said cells, wherein said small-signal probing voltage is time-dependent in an arbitrarily selectable fashion and has voltage amplitudes and/or durations less than those required for causing significant permanent change in the polarization states of said cells, wherein said logic state is determined by detecting components in said current response from said selected cell, wherein the components of the current response are temporarily correlated with said small-signal probing voltage or referencing signals derived from same, and wherein a decision on a logic state of a selected cell is performed on the basis of a comparison of said current response with a set of predefined criteria.

The present invention also relates to apparatuses for performing the method.

During recent years, data storage has been demonstrated in electrically polarizable media consisting of thin films. Of particular, interest in the present context are electrets, and ceramic or polymeric ferroelectrics, where the logic state of an individual memory cell is represented by the polarization direction of the thin film in that cell. In the case of ferroelectrics, data are written into the memory cells by polarizing the film in the desired direction through the application of an appropriately directed electrical field exceeding the coercive field of the ferroelectric. A major advantage of such materials is that they retain their polarization without the continuous supply of electrical energy, i.e. the data storage is non-volatile.

Two main classes of memory devices have been demonstrated, with fundamentally different device architectures In the first class of devices, each memory cell incorporates at least one transistor. The overall memory architecture is of the active matrix type, the major advantage compared with traditional SRAM and DRAM devices being the non-volatile nature of the ferroelectrically stored logic state. In these types of devices, the need for one or more transistors in each cell represents a major disadvantage in terms of complexity and reduced data storage with respect to device area.

In the second class of devices, which is of particular relevance here, memory cells are laid out in a passive matrix architecture where two sets of mutually orthogonal electrodes form arrays of capacitor-like structures at the crossing points between the electrodes. Each capacitor constitutes a memory cell with ferroelectric film sandwiched between the electrodes.

According to prior art, data are written to or read from individual memory cells by applying to the material in each cell in question an electrical field of sufficient magnitude to overcome the hysteresis effect and align the electrical polarization in the cell in the direction of the applied field. If the material already was polarized in that direction prior to application of the field, no polarization reversal takes place and only a small transient current flows through the cell. If, however, the material was polarized in the opposite direction, polarization reversal takes place, causing a much larger transient current to flow through the cell. Thus, reading the logic state in an individual memory cell, i.e. determining the direction of the electrical polarization in the cell, is achieved by application of a voltage of magnitude sufficient to exceed the coercive field in the ferroelectric, and detection of the resulting current.

Compared to active matrix-based devices, the passive matrix-based ones can be made with much higher memory cell density, and the memory matrix itself is much less complex. However, the readout process according to prior art is destructive, involving loss of the data content in the cell that is read. Thus, data that are read must be written back into the memory device if further storage of those data is desired. A more serious consequence of the polarization switching is fatigue, i.e. a gradual loss of switchable polarization which typically is accompanied by a need for higher applied voltage to the cell to effect the polarization reversal. Fatigue limits the number of read cycles that can be sustained by a given memory cell and thus the range of applications. In addition, it leads to slower response and higher voltage requirements for the memory device. The attendant gradual variation in the operation parameters for individual memory cells in a given device cannot seldom be predicted a priori and leads to a need for "worst case" design and operation which is sub-optimal.

Efforts have been made to develop techniques that allow non-destructive readout from ferroelectric-based memories while maintaining a simple elementary memory cell architecture.

C. J. Brennan discloses ferroelectric capacitor cells and associated elementary circuit modules for data storage in U.S. Pat. Nos. 5,343,421; 5,309,390; 5,262,983; 5,245,568; 5,151,877 and 5,140,548. By probing the small-signal capacitance values while simultaneously subjecting the ferroelectric to moderate bias fields, i.e. bias fields that do not lead to the peak voltage across the cell during readout exceeding the coercive field in the ferroelectric, the direction of the spontaneous polarization in the capacitor and thus the logic state of the memory cell is determined. However, there are certain very specific premises for applying the methods and apparatus as described by Brennan, invoking phenomena based on space charge accumulation at the electrodes which is explicitly dependent on the materials used in the electrodes and the adjoining ferroelectric. Readout of data involves probing of the space charge, which must be performed on time scales that are compatible with such charge accumulation. Furthermore, Brennan's patents contain no teachings on how the small-signal and biasing voltages shall be timed and correlated in relation to each other, which is of paramount importance for implementation in practical devices. Neither are there any teachings on how the memory cells in question can be arranged and addressed in large arrays that allow efficient and reliable read and write operations.

In international patent application No. PCT/NO01/00472 which is assigned to the present applicant, a set of non-destructive readout techniques and associated apparatus are disclosed and discussed in conjunction with ferroelectric thin-film capacitor memory devices. Readout is effected by subjecting the memory cells to a combination of time-dependent voltages, eliciting a small-signal current response with linear and non-linear components that, are processed to determine the logic state of each cell. Whereas the memory cell structures in question are eminently adaptable to passive matrix-addressing schemes, the question of how this shall be done in practice is not disclosed. This is a matter of great importance, the resolution of which shall determine whether the above referred non-destructive readout schemes are ultimately viable or not.

Summing up the discussion of prior art, it indicates that in conjunction with memory cells provided in passive matrix-addressable memory structures, where the cells are in the form of capacitors that are filled with an electrically polarizable material exhibiting hysteresis, e.g. a ferroelectric material, there is a need for devices and methods whereby data can be read non-destructively without parasitic contributions from non-addressed cells in the matrix corrupting the readout.

It is a major object of the present invention to provide strategies and methods for non-destructive readout of the logic state of selected memory cells that are addressed via a passive matrix arrangement, while at the same time avoiding corruption of the measurements by parasitic signal contributions due to particularly capacitive couplings in the matrix, as such capacitive couplings will be manifest in, e.g. capacitive pick-up of signals (charges) from the non-addressed cells in the matrix, or capacitive pick-up from the network of electrodes and cells surrounding the selected cells in the matrix.

It is a further object of the present invention to describe generic procedures and provide specific examples of apparatuses for implementing the strategies and methods referred above.

It is yet a further object of the present invention to achieve essentially fatigue-free readout from memory devices, without any need for write-back after each read operation.

The above objects as well as further features and advantages are realized with a method according to the invention, which is characterized by applying time-dependent potentials on selected word and bit lines or groups of word and bit lines, said time-dependent potentials being mutually coordinated in magnitude and time such that the resulting voltages across all or some of the non-addressed cells at the crossing points between inactive word lines and an active bit line or active bit lines and/or between inactive bit lines and at least one active word line are brought to contain only negligible voltage components that are temporally correlated with said small-signal probing voltage or referencing signals derived from the same.

Usually and advantageously only a single word line will be activated at a time when performing the method according to the invention.

In the method according to the invention it is considered advantageous subjecting inactive word and/or bit lines to potentials that dynamically track with high fidelity and in real time the voltages applied to the active bit and/or word lines, respectively; and/or controlling the potentials on inactive word lines by dedicated signal sources that derive a signal from an active bit line or active bit lines to dynamically track the potential on said active bit line or bit lines; and/or controlling the potentials on inactive bit lines by dedicated signal sources that derive a signal from an active word line to dynamically track the potential on said active word line; and/or controlling the potentials on inactive word lines by electrically latching the same via switches and wiring to the potential on an active bit line or active bit lines; and/or controlling the potentials on inactive bit lines by electrically latching the same via switches and wiring to the potential on an active word line.

In the method according to the invention it is considered advantageous employing an active electronic circuit connected to each active bit line which maintains the potential on an active bit line at a predefined value, and it is then preferable selecting said predefined value as a system ground potential. Also it is then preferred that all bit lines are active bit lines. Further in that connection it is preferable providing a multiplexer or passgate bank to connect one active bit line at a time to an active electronic circuit which maintains the potential on said one active bit line at the predefined value; or alternatively preferable providing a multiplexer or passgate bank to connect a selected set of active bit lines at a time to a set of active electronic circuits which maintain the potential on the active bit lines at the predefined value. Also in that connection it is preferred that the active electronic circuit shall provide information on the charge or current flowing into an active bit line.

In the method according to the invention it is considered advantageous latching inactive word lines and/or inactive bit lines to a system ground potential via bank of passgates or switches.

In the method according to the invention it is considered advantageous providing a multiplexer or pass gate to connect one active word line at a time to an electronic circuit which controls the potential on said one active word line according to a predefined protocol; and then it is preferred that the potential on said one active word line includes a superposition of a small-signal probing voltage and a background biasing voltage.

In a first embodiment of the method according to the present invention a current response from selected memory cells is analysed with a boxcar method, said boxcar method employing timing signals derived from the circuits controlling the potentials on an active word line and/or an active bit line or active bit lines.

In a second embodiment of the method according to the present invention the current response from selected memory cells is analysed with a lock-in method, said lock-in method employing one or more reference signals in the frequency domain derived from circuits controlling the potentials on said active word and/or said active bit lines. In that connection it is preferred performing the analysis with a reference signal derived from the probing voltage component of the voltage applied across said selected memory cells; or alternatively performing the analysis with a reference signal derived from a biasing voltage component of a voltage applied across said selected memory cells; or performing the analysis with dual reference signals, one reference signal being derived from a probing voltage component and one from a biasing voltage component of a voltage applied across said selected memory cells; or performing the analysis of the current response using dominant frequency components of at least one of the following, viz. the fundamental or higher harmonics ($2^{nd}$, $3^{rd}$ . . . ) of a probing voltage in the case where said probing voltage contains a single dominant frequency, or the fundamental or higher harmonics ($2^{nd}$, $3^{rd}$ . . . ) of one or more components of said probing voltage, where said components contain two or more separate dominant frequencies, or sum or difference frequencies generated by adding and/or subtracting said two or more dominant frequencies.

The above objects as well as further features and advantages are also realized with a first apparatus for performing the method of the invention, the apparatus being characterized in comprising respective sense amplifier circuits provided for each bit line and connected therewith and clamped to virtual ground, a respective lock-in amplifier connected with the output of each sense amplifier circuit, and having an input for a reference signal and an output for a readout signal, a combined bias voltage and signal source having an output connected with the reference signal input of the lock-in amplifier for providing a reference signal thereto, an active word line driver connected with another output of the combined bias voltage and signal source, said active word line driver having an output connected with a multiplexer for selecting an active word line and being provided connectable at one end of the word lines, and a passgate bank provided at the other end of the word lines for clamping all inactive word lines to ground, whereby the apparatus allows parallel readout of all memory cells on an active word line.

The above objects as well as further features and advantages are also realized with a second apparatus for performing the method according to the invention, the apparatus being characterized in comprising a multiplexer connected at one end of the bit lines, a sense amplifier circuit connected with the bit line multiplexer and clamped to virtual ground, a lock-in amplifier connected with the output of the sense amplifier circuit and having an input for a reference signal and an output for a readout signal, said bit line multiplexer providing the selection of an active bit line for readout, a combined bias voltage and signal source having an output connected with the reference signal input of the lock-in amplifier for providing a reference signal thereto, an active word line driver connected with another output of the combined bias voltage and signal source, said active word line driver having an output connected with a multiplexer for selecting an active word line and being provided connectable at one end of the word lines, a first passgate bank provided at the other end of the word lines for clamping all inactive word lines to ground, a second passgate bank provided connectable to the other end of the bit lines for clamping all inactive bit lines to ground, and whereby all memory cells on an active word line can be addressed in parallel combined with a sequential readout of the sense amplifier circuit according to a suitable timing protocol.

Figure 2:
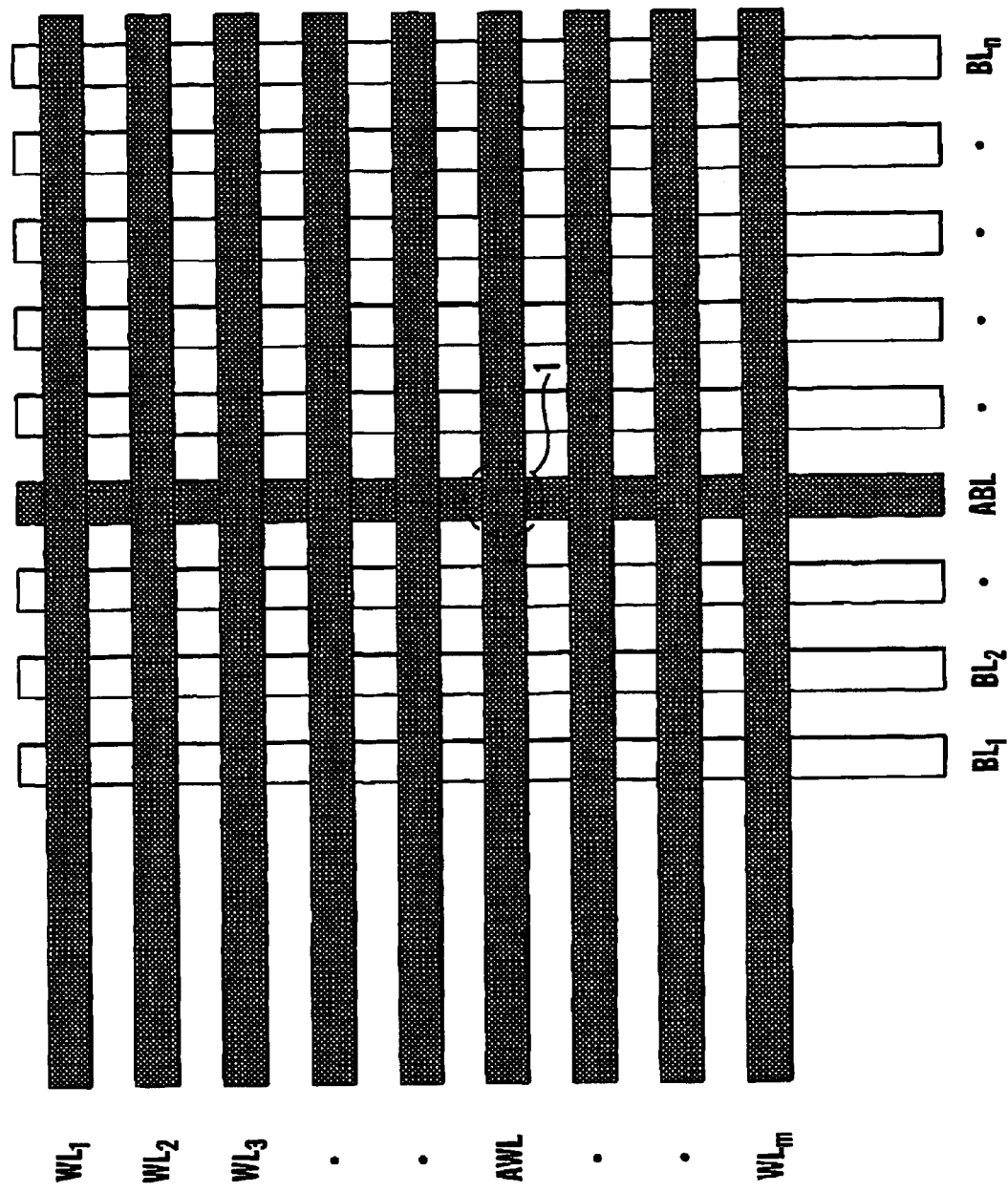
Figure 3:
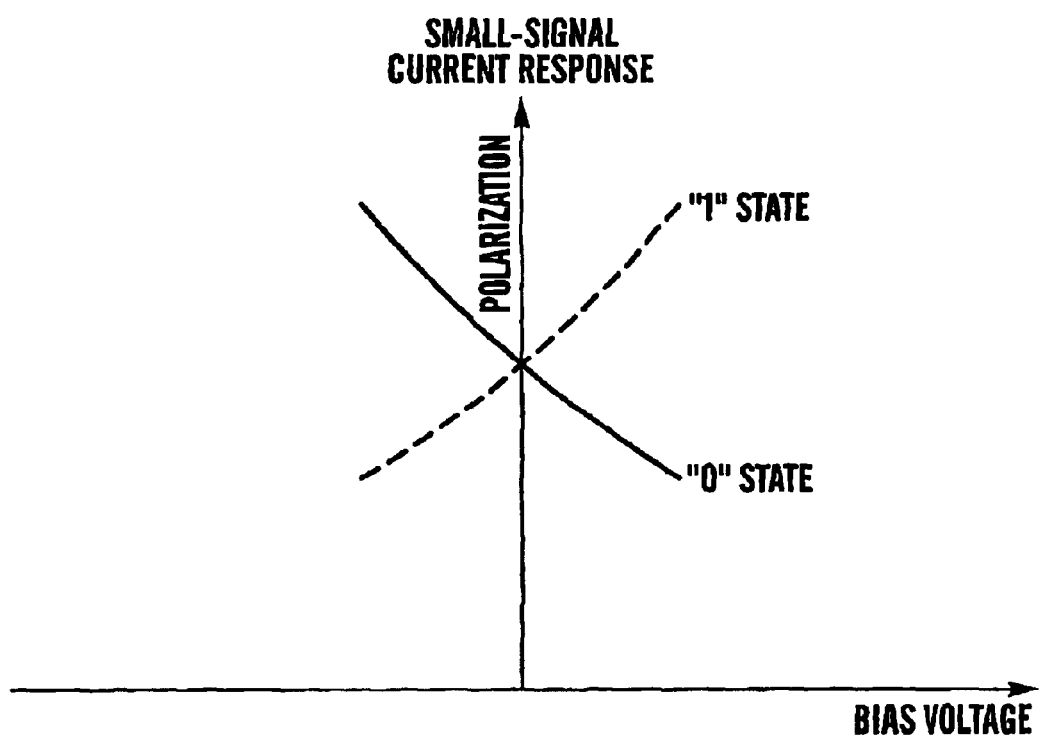
Figure 4A:
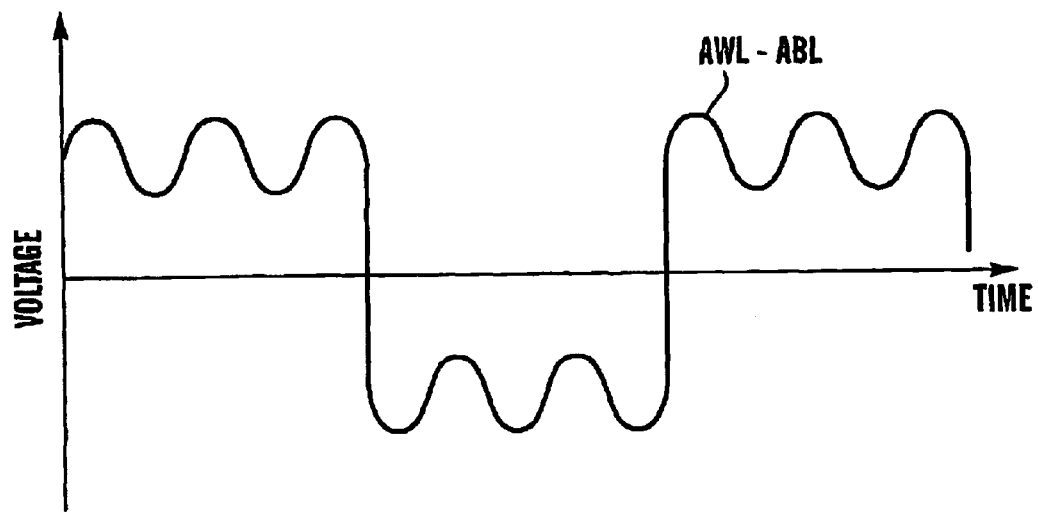
Figure 4B:
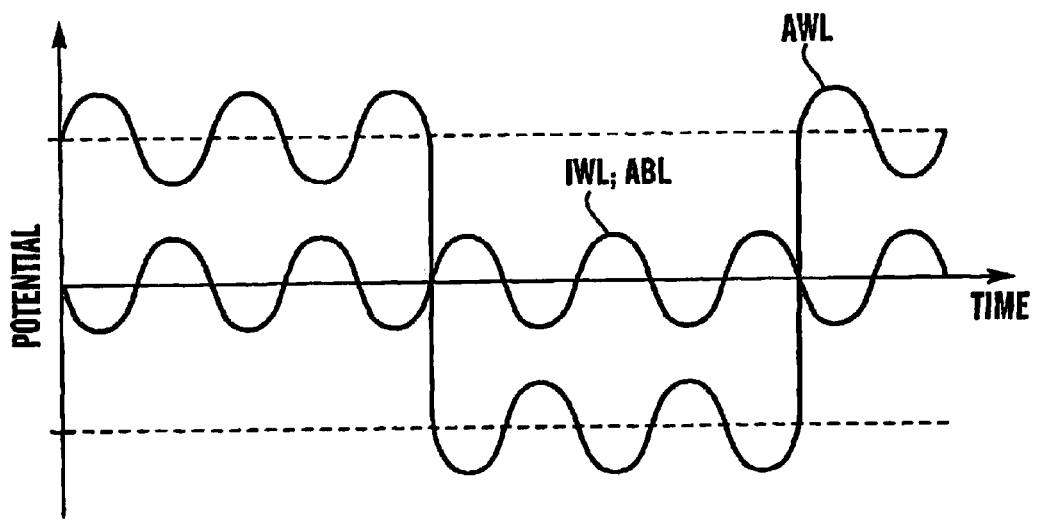
Figure 5:
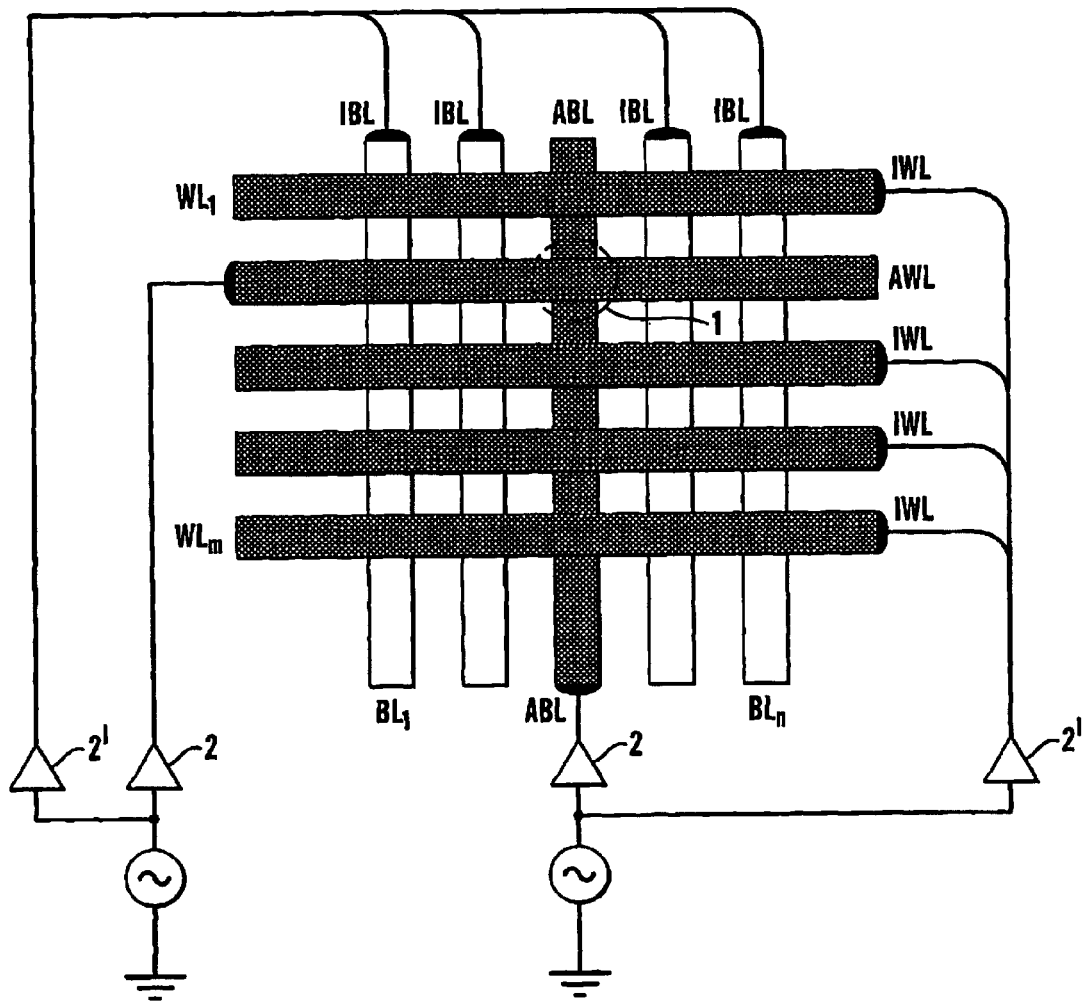
Figure 6:
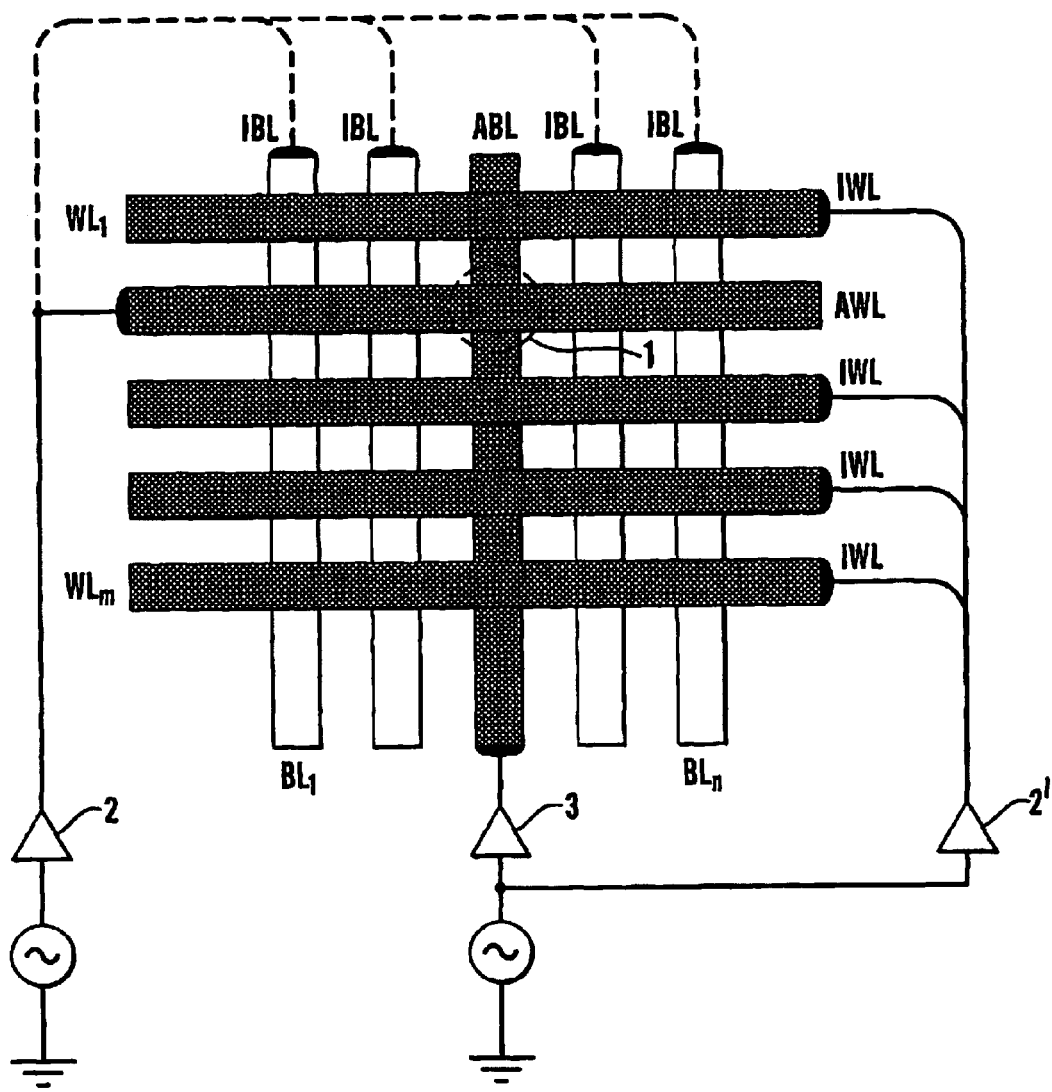
Figure 7:
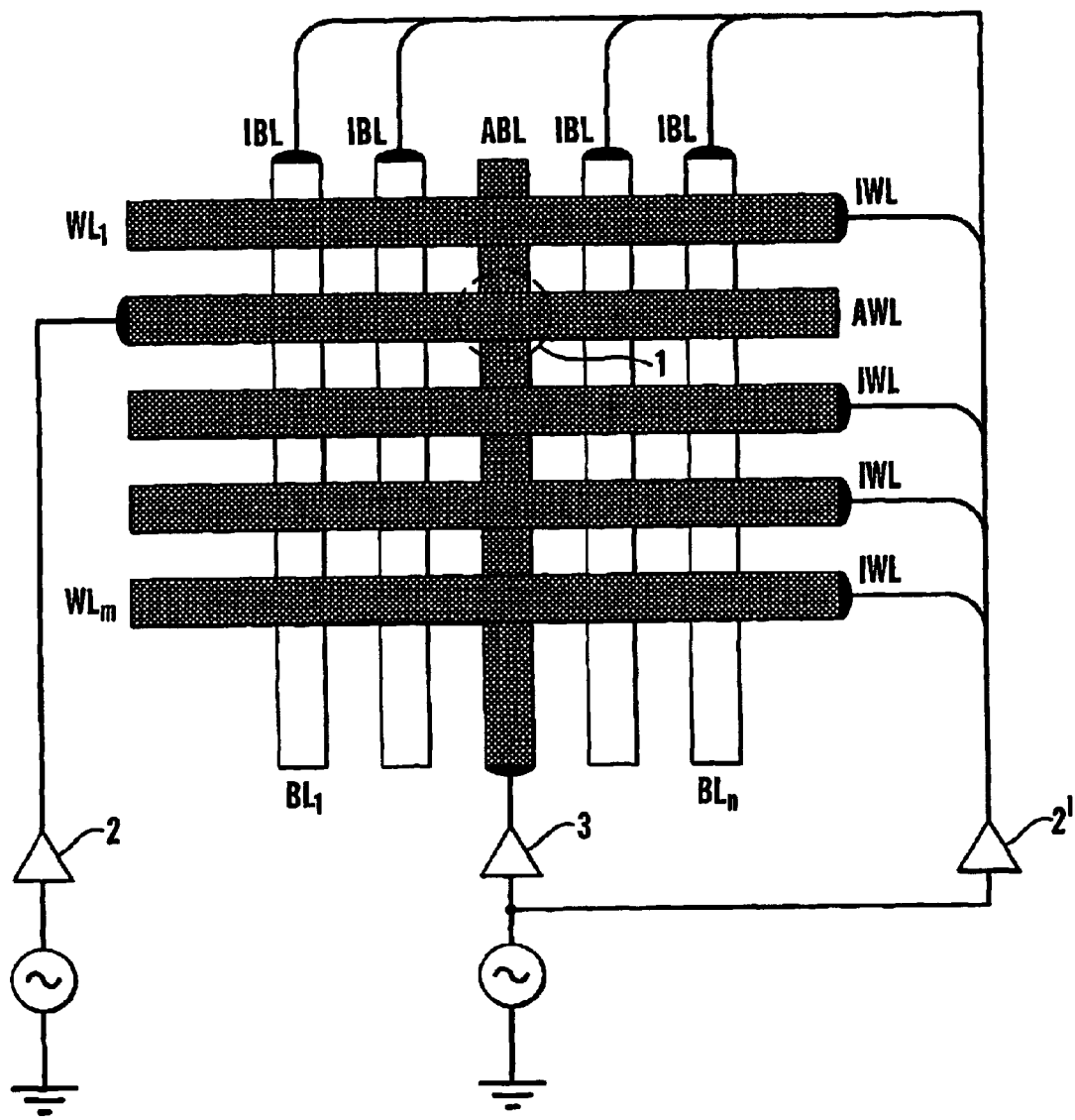
Figure 8:
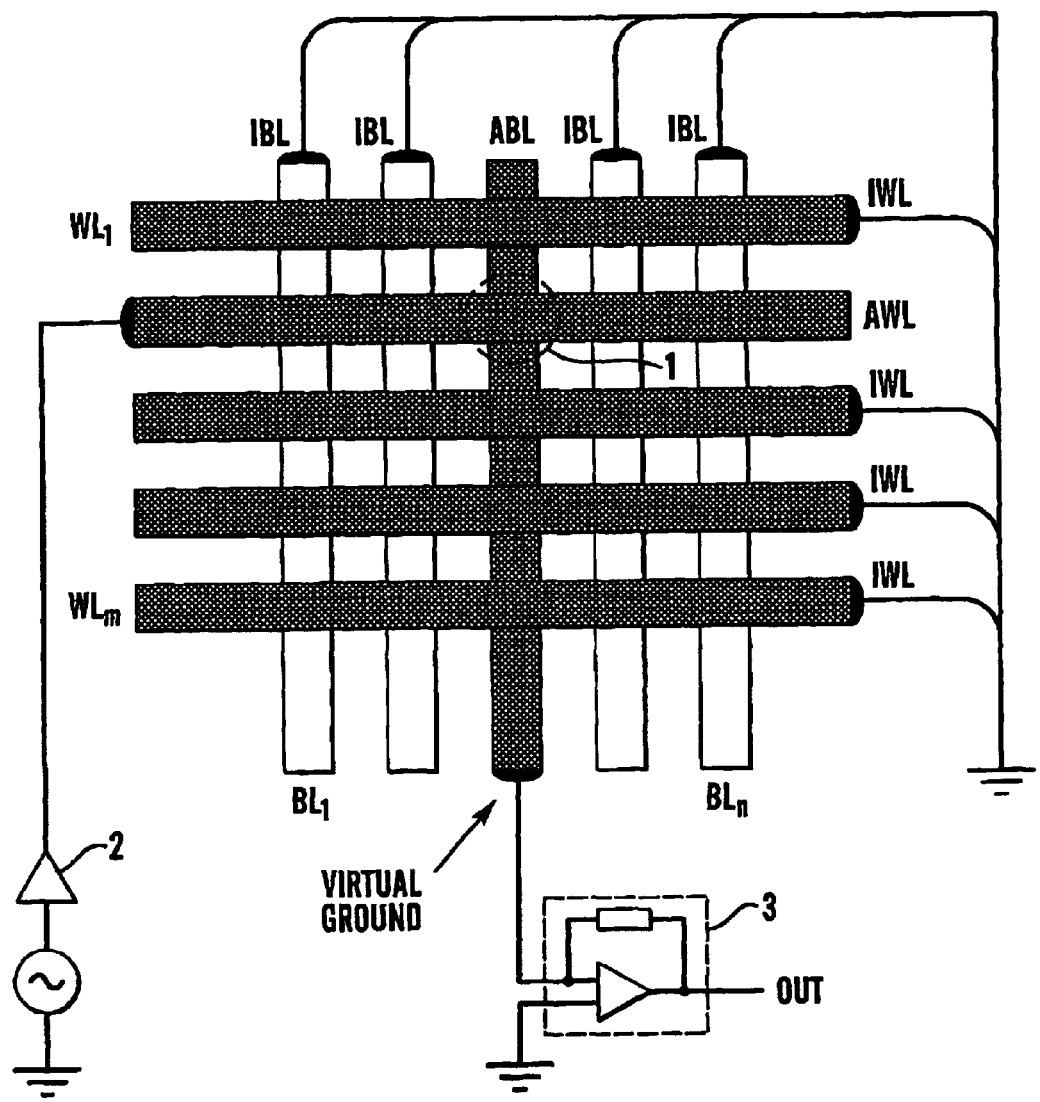
Figure 9:
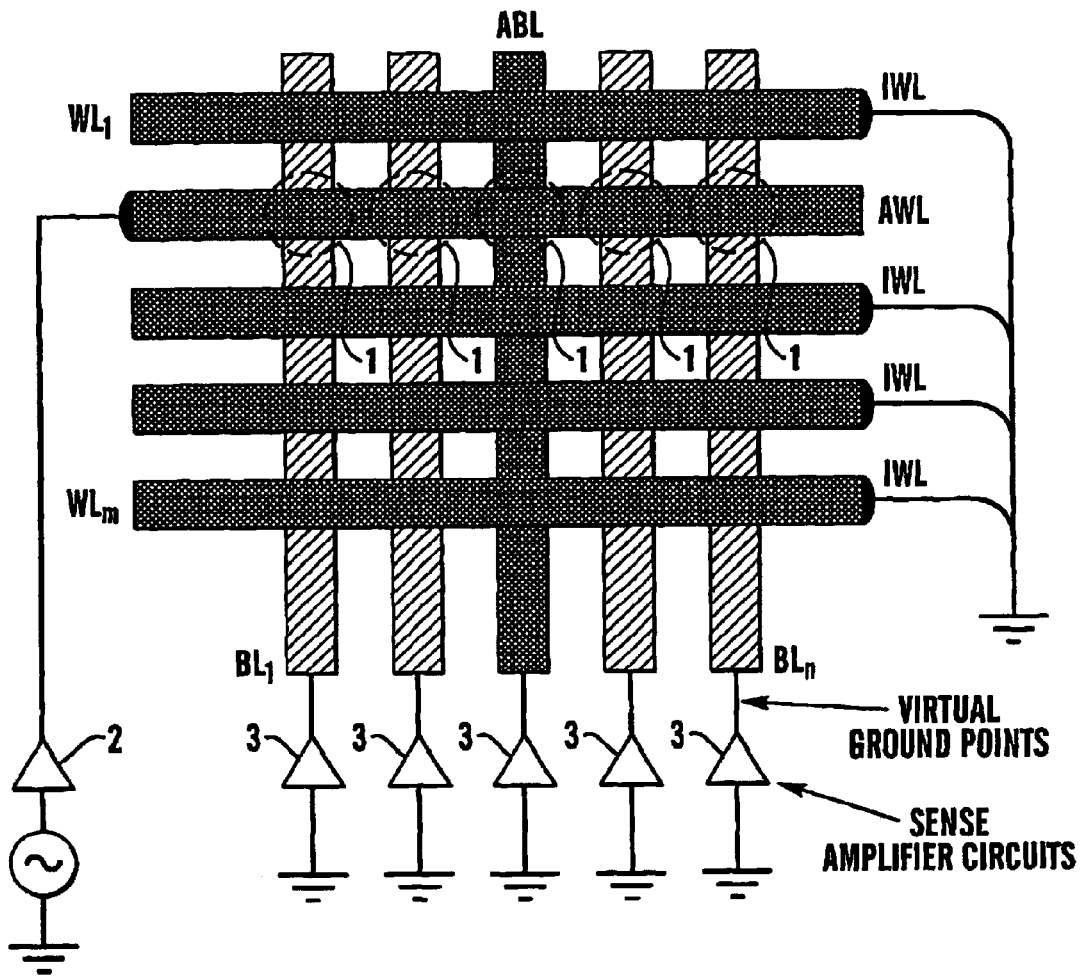
Figure 10:
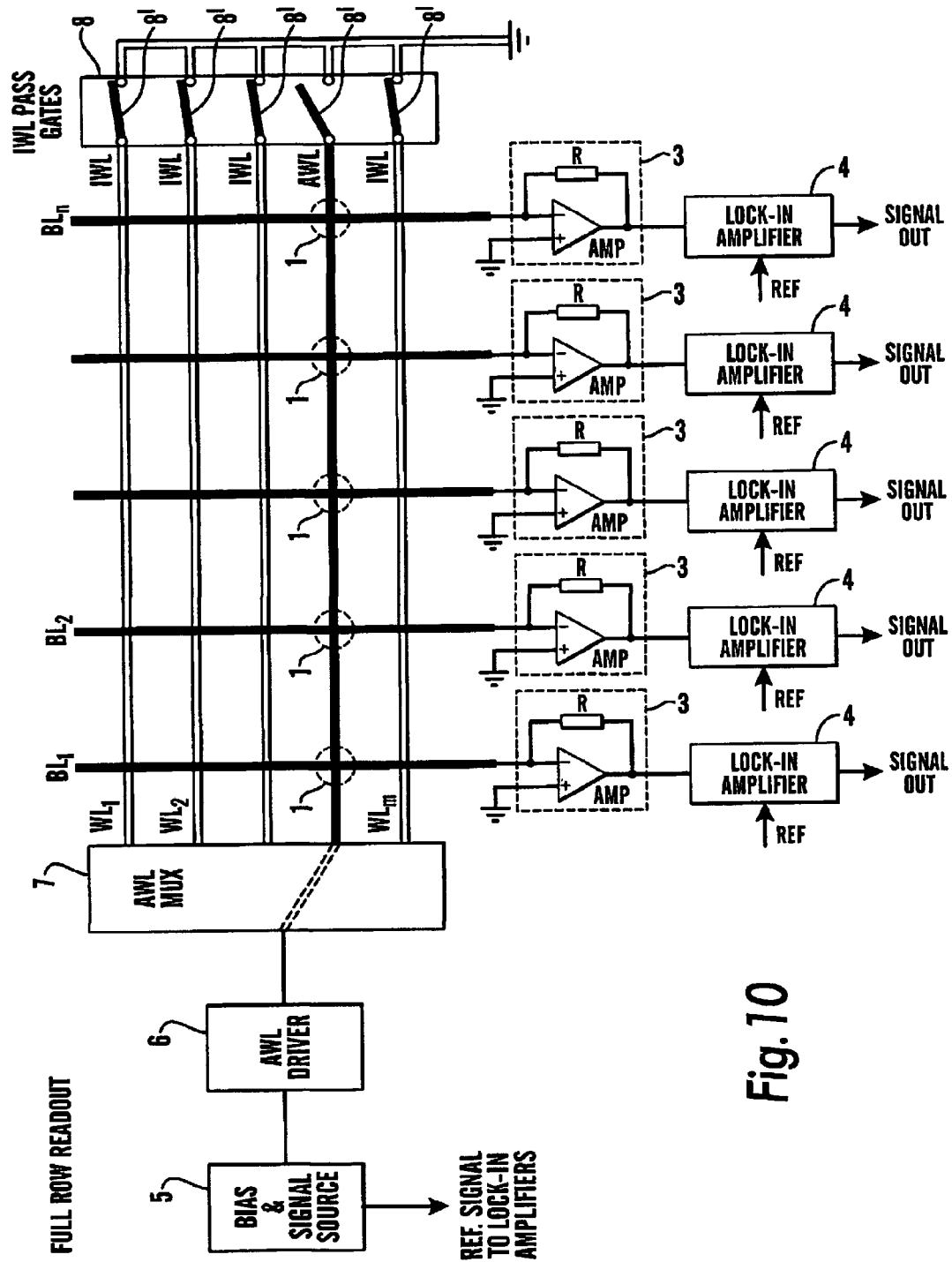
Figure 11:
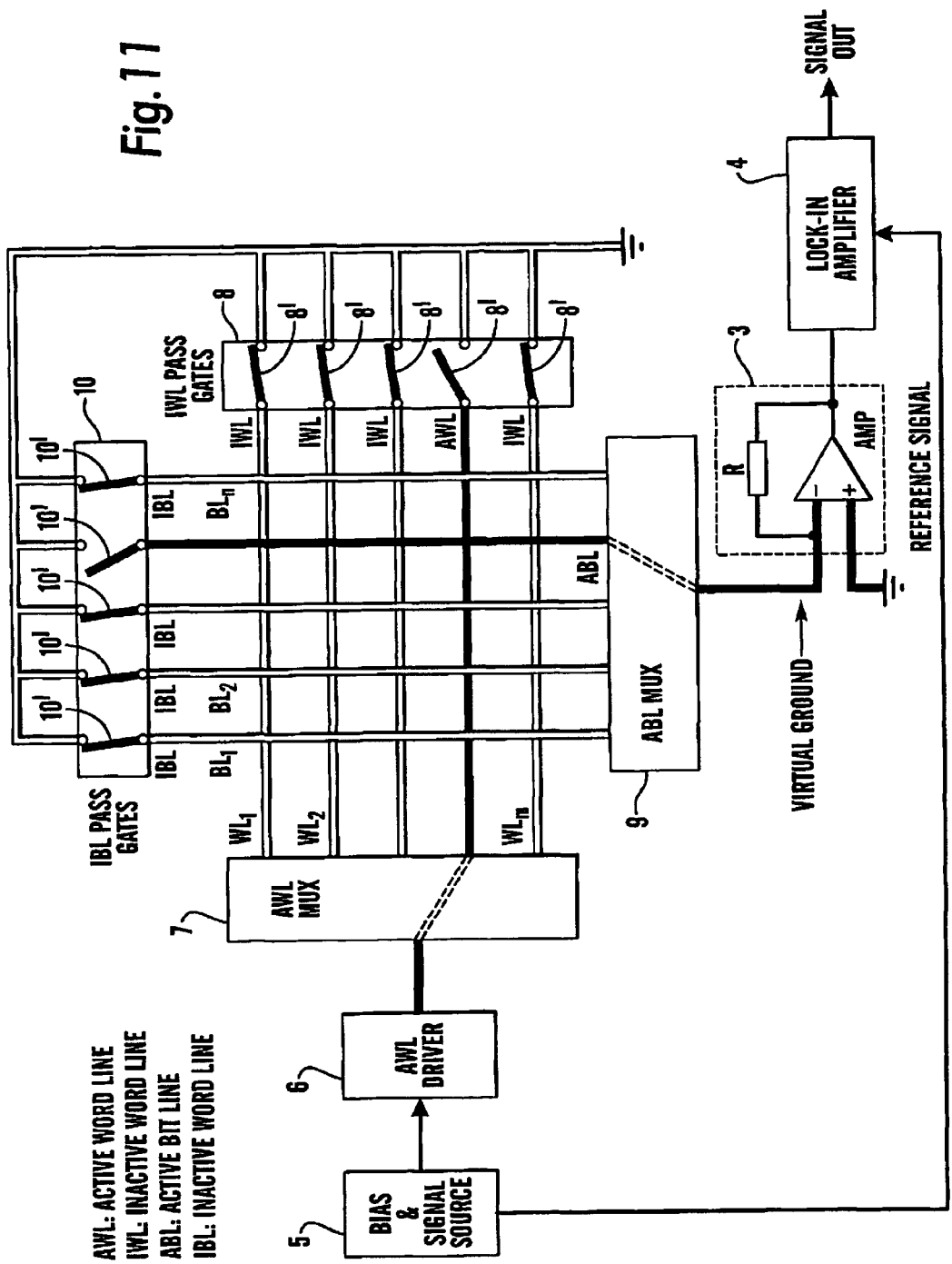

The present invention will become more readily apparent from the following detailed discussion of preferred embodiments of the invention with reference to the accompanying drawings figures, of which FIG. 1 shows a general hysteresis curve for a memory material of the ferroelectric type, FIG. 2 the electrode arrangement in memory with passive matrix addressing such as for instance a ferroelectric memory used with the present invention, FIG. 3 the a typical small-signal current response behaviour of e.g. a ferroelectric memory cell, FIG. 4a an example of a readout voltage pattern as obtained with the method according to the present invention, FIG. 4b the potential patterns corresponding to the readout voltage pattern, FIG. 5 the principle of a first embodiment of the method according to the invention, FIG. 6 a variant of the embodiment in FIG. 5, FIG. 7 another variant of the embodiment in FIG. 5, FIG. 8 an example of a sense amplifier circuit as used with the present invention, FIG. 9 the principle of a second embodiment of the method according to the invention, FIG. 10 the structure of a first apparatus according to the invention for performing the second embodiment of the method according to the invention, and FIG. 11 the structure of a second apparatus for performing the second embodiment of the method according to the invention.

Before the invention is described in greater detail, the general background of the present invention shall briefly be discussed.

FIG. 1 shows a typical hysteresis curve for a ferroelectric material, with the two stable polarization states in zero external field indicated by the assigned logic states "0" and "1", respectively.

The hysteresis curve gives the electric polarization in microfarad/cm$^2$ versus the electric potential in volt. In FIG. 1 positive polarization is taken to represent a logic "0", while negative polarization is taken to represent a logic "1". Further $V_c$ denotes the coercive voltage, $P_R$ gives the remanent polarization, while $\hat{P}$ is the difference between the electric polarization at saturation voltage and remanaent polarization $P_R$. Finally, P* denotes the total change of the polarization when its polarity is reversed, as will be the case when the memory cell is switched from a logic "0" to a logic "1", as may take place in a destructive readout of a memory cell.

FIG. 2 shows the electrode arrangement as commonly employed with a passive matrix-addressable ferroelectric memory. The memory medium itself, i.e. the ferroelectric material, is provided sandwiched between respectively a first row of parallel electrodes $WL_1$–$WL_m$, termed horizontal electrodes and a second row of parallel electrodes $BL_1$–$BL_n$ oriented orthogonally to the first set of electrodes and termed vertical electrodes, thus forming an orthogonal electrode matrix. On applying a voltage to respectively horizontal and vertical electrodes, memory cells are affected at the crossings or the crossings of the electrodes in the matrix. On applying a voltage to a specific horizontal and a specific vertical electrode, a potential will be formed across the memory cell in question and it will obtain an electric polarization of either the positive or negative kind corresponding to respectively a logic "0" and logic "1", as applicable or according to a predetermined protocol In the present invention the focus shall be particularly directed towards certain specific non-destructive readout schemes of the types referred in the prior art reviewed above, and considered relevant in connection with the present invention. Typically, readout takes place by measuring the small-signal response of the memory cell in question through the application of a small-signal time-varying test voltage across the selected cell in question, while at the same time providing a superimposed bias voltage with a slower time variation than that of the small-signal test voltage. The logic state is generally revealed by recording the dependence of the recorded small-signal response upon the bias voltage. The latter may be chosen to vary according to a predefined schedule, e.g. being switched between two values of the same or opposing polarities, or being periodically modulated between two extreme values. The small-signal response may be, e.g. the memory cell capacitance at the frequency of the small-signal test voltage, or it may be the amplitude or phase of a higher harmonic response signal.

In keeping with common usage and with reference to FIG. 2, the following nomenclature shall apply in the following, viz. denoting horizontal electrodes WL as word lines, and vertical electrodes BL as bit lines. Those memory cells that are selected for writing, reading, erasing or refreshing are termed selected cells, while the rest are non-selected cells. A word line WL that connects to one or more selected cells is termed an active word line (abbreviated: AWL), and a bit line BL that connects to one or more selected cells is termed an active bit line (ABL). Correspondingly, a word line WL and bit line BL that do not connect to any selected cells is termed an inactive word line (IWL) and inactive bit line (IBL), respectively.

A fundamental and recurring problem in storing, reading and erasing of data in passive matrix-addressable memory arrays is the large number of electrical linkages within the network of electrodes and memory cells in the matrix. Thus, application of a voltage to a set of mutually crossing word and bit lines in order to address a given cell or group of cells in the matrix may at the same time cause non-addressed cells in the matrix to be subjected to voltages that may disturb their logic states, or such non-addressed cells may contribute electrical charges which corrupt the response that is measured from the addressed cells. This may be illustrated with reference to FIG. 2. Assume e.g. that it is desired to read the logic state of the memory cell 1 at the overlap between the active word line AWL and the active bit line ABL in the matrix as shown. Assume further that readout is to be performed by application of a time-dependent voltage to the cell 1 and measurement of the resulting current response. Since measurements are performed via connections to the active word and bit lines AWL; ABL at the edges of the matrix, potentials imposed on those lines are also felt at the non-addressed cells connecting to those lines. Thus, depending on the overall distribution of potentials and impedances throughout the matrix, parasitic signals from a large number of non-addressed cells may add to the measured response from the addressed cell 1. This problem can be readily acknowledged by persons skilled in the electronic art, considering that practical devices shall involve matrices with hundreds or thousands of word and bit lines.

Passive matrix addressing is unique in combining high memory cell density with architectural simplicity and flexibility. To the inventors' knowledge, however, there does not exist any relevant prior art that solves the problem of parasitic signals in passive matrix-addressable memory devices employing non-destructive readout schemes of the types taught by Brennan in the patents referred above, or of the type taught in the above-mentioned international patent application No. PCT/NO01/00472, also referred above, or of similar schemes. Such non-destructive readout schemes shall remain of academic interest only, if they cannot be combined with realistic and efficient means of addressing.

Although, as stated in the introduction, the present invention is particularly devoted to eliminating parasitic signal contributions such as caused by capacitive couplings, it shall be understood that in a passive matrix-addressable memory device on which the method according to the invention is to be applied, also inductive or radiative couplings may be present, causing inductive or radiative pick-up from the network of electrodes and cells surrounding the selected cells in the matrix. This may more readily be seen when one considers that the memory matrix can be regarded as a network of capacitive, inductive and resistive elements, where in addition time-varying voltages or currents having frequency components may be flowing in the matrix. However, simulation studies were carried out on large passive-addressable memory matrices and based on using a simplified model of the matrix, i.e. a lumped circuit model where the coupling between the different lines in the matrix can be described using capacitive, inductive and resistive lumped elements. Carrying out a simulation of the fields based on a two-dimensional model that mimics the behaviour of the actual device with reasonable accuracy, it not unexpectedly turned out that capacitive couplings were the primary cause of parasitic signal contributions, while inductive couplings in practice could be neglected. Also radiative effects appeared negligible. Even though signals flowing in the matrix may have frequency components, the signals can be considered as slowly time-varying and frequencies correspondingly low. Any capacitive and inductive couplings can be considered as near-field effects and the actual dimensions of the matrix also ensure that retardation effects shall not be present. At 1 GHz the wavelength of an electromagnetic wave is 33 cm, while the device to which the method according to the invention is applied conforms to the dimensions of standard microcircuit technology, i.e. with the linear dimensions in order a few millimeters and up to, say 1 cm. Increasing the storage density, i.e. the cell density of the memory device, might make it more prone to parasitic effects, but any scaling down of line widths, pitches, and cell sizes shall without altering charge densities and field strengths also be accompanied by a corresponding reduction in the operating voltages. In any case, to conclude, the memory device in question can for all practical purposes be regarded primarily as consisting of lumped capacitive structures or lumped charges in a network, said charges being either static or only slightly affected in the course of an addressing operation, introducing at most near-field coupling effects with frequencies far below those expected to be conducive to the occurrence of any radiative couplings. In light of the foregoing considerations the following discussions of specific embodiments of the method and apparatuses according to the invention should then be understood as relating substantially to the reduction of parasitic signal contributions arising from capacitive couplings only, without being overly concerned with either inductive or radiative couplings.

The present invention shall now be discussed in detail and more concrete terms with explicit referenced to various preferred embodiments thereof.

The basic idea of the present invention stems from the observation that parasitics derive from currents flowing through cells and electrodes in the matrix, driven by potential differences. Simply stated, these currents would cease to flow if all parts of the matrix were kept at equipotential at all times. However, the readout processes of relevance here demand that the selected cells shall be subjected to a time-varying voltage.

According to the present invention, the problem is solved by applying time-dependent potentials to the electrodes in the matrix such that the appropriate biasing and probing voltages appear across the selected cells, while all non-selected cells experience zero voltage across them in a dynamic sense. This is achieved through correlated driving of the potentials on word and bit lines in time and magnitude such that the word and bit lines crossing at non-selected cells have potentials that are locked to each other. Thus, if the word line potential at a given non-selected cell is forced to execute variations to emulate precisely and in real time the time-dependent potential impressed on the bit line connecting to that same cell, a dynamic equipotential results across said cell. As shall be described in connection with preferred embodiments below, the word and bit lines crossing at said non-addressed cells may both have time-dependent potentials that vary in lockstep with each other, or they may both be clamped to the same quasistatic potential.

The basic principle shall now be illustrated with the aid of FIGS. 3 and 4. FIG. 3 renders the small-signal current response behaviour of a memory cell polarized in either direction corresponding to a logic "0" and a logic "1" respectively. FIG. 4a renders the voltage readout pattern as perceived by a selected memory cell with a small-signal sinusoidal probing voltage superimposed on a square-wave biasing voltage. Assume that the memory cells exhibit the small-signal capacitance versus voltage behaviour shown in FIG. 3. As can be seen, the logic states "0" and "1", can be determined by applying a bias voltage and recording the attendant change in capacitance. The bias voltage may be time-dependent and applied as, e.g., a sinus or square wave with a characteristic period much slower than that of the small-signal voltage used to measure the capacitance. In the latter case, the perceived voltage a cross the selected cell shall vary in time as indicated in FIG. 4a. This voltage is generated by the difference in instantaneous potentials between the active word line and active bit line crossing at the selected cell, cf. curves marked IWL and ABL in FIG. 4b, where the active word line and active bit line potentials are chosen to be sinus waves of opposite phases. If the inactive word line potential is controlled so as to mimic the active bit line potential as indicated by the curve marked IWL in FIG. 4b, the net potential difference between IWL and ABL (which corresponds to the voltage perceived by all non-selected cells on the active bit line) can be seen to be zero at all times. Thus, when recording the current response by a sensing circuit connected to the active bit line, all cells except the selected one shall experience zero net voltage across them.

In many practical situations, this simple procedure of exactly matching the potential on each side of non-addressed cells needs to be extended and modified. Depending on the, mode of logic state discrimination (capacitance versus bias voltage, second or higher harmonic, sum-or-difference frequency), the most damaging signal contributions from parasitic currents shall generally occur at frequencies well removed from those contained in the typically lower-frequency biasing component of the voltage applied to the selected memory cells. Thus, the dynamic potential equilibration of word and bit lines shall in many cases need to be applied only at certain specific frequencies that are derived from the overall voltage applied on the selected memory cells. A simple example of this is the case where a capacitance versus bias voltage measurement is performed with a high frequency probing voltage applied at a frequency $\omega$, superimposed on a low frequency bias voltage at frequency $\Omega$. Assuming linear response, it is sufficient in this case to perform equilibration of word and bit line potentials across non-selected cells at frequency $\omega$.

Primarily, and as mentioned in the introduction, the present invention is focused on eliminating or reducing capacitive couplings. Hence it is a most important aspect of the invention to eliminate capacitive pick-up in the readout process.

At high frequencies, the readout may in addition be corrupted by parasitic pick-up caused by inductive and radiative couplings, with word and bit lines elsewhere in the matrix. Although these two couplings, as shown in a preceding section, are of lesser concern, a further and not entirely unimportant aspect of the present invention is to minimize parasitic signal pick-up arising from also such couplings. This is achieved according to one class of embodiments of the present invention by prescribing that during the readout cycle all non-addressed word and bit lines are brought to coexecute potential variations to emulate relevant signal components impressed on the active bit line or group of bit lines. This of course ignores retardation effects, but in most practical memory devices each addressing matrix shall be small enough and the frequencies low enough for this approximation to be valid.

The single cell excitation example given in FIGS. 4a and 4b show how capacitive pick-up from non-addressed-cells on inactive word lines crossing the active bit line is avoided by coordinated application of voltages on all inactive word lines such that the only non-negligible small-signal excitation voltages occur across at the addressed cell. In the following, the problem of incorporating the principles taught in the present invention into matrices containing a plurality of word and bit lines shall be addressed, and some preferred embodiments shall be described. It is understood that the latter shall in no way represent the full scope of the present invention.

A first embodiment of the method according to the invention shall now be discussed with reference to FIGS. 5–8, wherein a single memory cell is addressed at random.

In FIG. 5 there is shown a passive matrix readout from a single memory cell performed with an active word line AWL and an active bit line ABL, both galvanically isolated from the inactive word and bit lines.

Particularly FIG. 5 shows how capacitive pick-up from non-addressed cells crossing the active word and bit line AWL; BWL is avoided by coordinated application of voltages on all inactive word and bit lines IWL; IBL such that only the non-negligible voltages occur across and at the addressed cell 1. As can be seen from the figure, this is achieved by all inactive word lines IWL mirroring the instantaneous potential on the active bit line ABL, and simultaneously all inactive bit lines IBL mirroring the instantaneous potential on the active word line AWL. In this way, no voltage appears across any of the non-addressed cells on the active word line AWL, and at the same time no voltage appears across any of the non-addressed cells on the active bit fine ABL.

In the scheme illustrated in FIG. 5, the active and the inactive word and bit lines are fed from two galvanically separated, but mutually coordinated signal generators 2,2', whereby the capacitance measurement on the addressed cell 1 can be performed directly across the terminals to the active word and bit line by a wide range of techniques and hardware.

FIG. 6 shows how current response is detected by a sensing circuit 3 on the active bit line ABL, while the active word line AWL is fed by signal source 2 with low source impedance. Inactive bit lines IBL may optionally be connected to the active word line AWL as shown. FIG. 6 thus illustrates what may be viewed as a sub-class of the scheme of FIG. 5, where the inactive bit lines IWL are directly voltage-clamped to the active word line AWL. The word line signal source 2 is now assumed to be "stiff", i.e. having very low source impedance, and the current response is detected by a sense amplifier 3 which records the current flowing into the active bit line ABL as the voltage protocol of the read cycle is run through. The potentials on the inactive word lines IWL are brought to mirror the potential on the active bit line ABL by means of the slave generator 2' shown in FIG. 5. Although the inactive bit lines IBL do not provide a capacitive current contribution to the active bit line ABL through non-selected cells, the scheme in FIG. 6 has certain useful attributes, e.g. by providing control of the potentials on inactive bit lines IBL. A simpler alternative is, of course, to allow inactive bit lines to float.

FIG. 7 shows a similar scheme to the one shown in FIG. 6, again with a selected cell 1, but now with all lines WL;BL in the electrode matrix being clamped to the active bit line potential via a slave signal source 2'. FIG. 7 thus shows another sub-class of the scheme of FIG. 5. Here, all lines in the matrix except the active word line AWL are clamped to the active bit line potential. An advantage of this scheme is that not only all inactive word lines IWL crossing the active bit line ABL are removed as parasitic signal sources, but pick-up from the other parts of the matrix, in particular capacitive pick-up from near-neighbour bit lines is removed.

The variants of the first embodiment according to the invention shown in FIGS. 5, 6 and 7 ensure that wherever the active bit line ABL crosses a inactive word line IWL, the cell at that point experiences near-zero voltage across it, and the only non-negligible contribution to bit line current flowing through the sense amplifier 3 is from the addressed cell 1. A sense amplifier circuit 3 may be configured as shown in FIG. 8, which illustrates how active bit lines ABL can be defined at virtual ground. This is a standard set-up for measuring capacitance, but can be employed for any of the detection modes relevant in the present context. By employing an operational amplifier with high gain, the input terminal and thus the bit line may be clamped at a desired potential which may be selected at will, but in many practical cases shall be identical to system ground. In that case, the point of connection to the active bit line ABL shall henceforth shall be defined as virtual ground. By employing a detection circuit with virtual ground, one observes from FIG. 7 that the entire matrix except the active word line AWL remains at ground potential. This has obvious beneficial consequences in terms of simplicity and shielding against parasitic signal pick-up. In this case the voltage swing (bias and probing voltage) across the selected cell 1 comes entirely from the active word line AWL, but the basic principle of equilibration of potentials across non-selected cells is maintained.

A second embodiment of the method according to the invention, whereby word lines WL are addressed in parallel, shall now be discussed with reference to FIG. 9. Again passive matrix addressing is used, but now with simultaneous addressing of a full row of memory cells on a word line, while parasitic signals at the same time are suppressed.

In this second embodiment each bit line is read in parallel with one or more, potentially all the other bit lines, by dedicated circuits 3 connected to each bit line BL, cf. FIG. 9. Thus, the whole matrix with the exception of the single addressed word line AWL can be kept at a common potential throughout the read cycle, with all inactive word lines IWL clamped to a chosen potential, e.g. ground, while the active word line AWL is connected to a signal generator 2 which provides a voltage bias as well as a small-signal probing voltage. This signal generator 2 has a low source impedance, i.e. it can maintain the programmed bias and test signal voltages on the connected active word line AWL without being affected by current drains to the crossing bit lines. Each individual bit line BL has a sense amplifier circuit 3 associated with it, e.g. similar to the one shown in FIG. 7, whereby the current flow into each bit line can be determined. The potential at the sense amplifier inputs and thus the bit lines BL are kept at virtual ground, ensuring that no capacitive charge transfer takes place at the cells linking bit lines BL to inactive (non-addressed) word lines IWL.

In this embodiment, two important advantages may be gained:

1) In addition to removing capacitive pick-up of charge from non-addressed cells on the active bit lines ABL, it is also desirable to minimize crosstalk by capacitive and in case also inductive or radiative couplings to word and bit lines elsewhere in the addressing matrix. Such problems are exacerbated as the signal frequencies increase and/or the physical distances between the word and bit lines diminish, i.e. as the device design is tweaked towards higher performance. With the present preferred embodiment, much reduced pick-up of parasitic contributions to the readout signals can be achieved since the whole matrix (excepting the active word line) can be maintained at the same potential, e.g. ground. This provides opportunities for greatly reduced pick-up of parasitic contributions to the readout signals.

2) Since each bit line BL crosses the active (addressed) word line AWL and is provided with its separate sense amplifier 3, parallel readout from all cells on the addressed word line AWL is possible, with a commensurate increase in output data rate from the matrix.

As is apparent for the person skilled in the electronic art, the second embodiment affords possibilities for achieving simplification of the potential control by direct wiring.

This shall be discussed in conjunction with FIGS. 10 and 11 which show the layout of a first and second apparatus respectively and both used for performing the second embodiment according to the invention.

In the full word line access scheme described above, it was assumed that each bit line had a dedicated sense amplifier circuit 3 associated with it. Generally, it is desired to pack cells in the matrix as close together as possible, implying that the bit line pitch should be minimized. This, however, leads to crowding along the array of sense amplifier circuits at the edge of the matrix, and the problem is exacerbated as the sense amplifier circuitry increases in complexity.

One way to avoid the crowding problem is to reduce the number of word line driver circuits and bit line sense amplifier circuits by connecting them to the word and bit lines WL;BL in the matrix by means of less real-estate consuming switches or routers. To this end, FIG. 10 particularly shows a first apparatus according to the invention for implementing a full word readout scheme employing a time-multiplexed active word line connection synchronized with switched clamping of inactive word lines WL to ground potential, in conjunction with bit lines BL with detection circuits clamping the bit lines to virtual ground. At one end of each bit line BL a sense amplifier circuit 3 similar to the one shown in FIG. 8 is connected and clamped to virtual ground. To each sense amplifier circuit 3 there is connected a lock-in amplifier 4 with an output for the readout signal and an input for the reference signal. The reference signal is generated by a combined bias voltage and signal source 5 with a reference output signal connected to the lock-in amplifiers 4. The bias voltage and signal source 5 also has an output to an active word line driver 6 having an output connected with a multiplexer 7 which selects a word line WL for readout, i.e. the active word line AWL, while simultaneously biasing inactive word lines IWL as appropriate. The opposite ends of the word lines are connected with a passgate bank 8 which allows the clamping of the inactive word lines IWL to ground by use of suitable switching means 8'. A full word line can hence be read, i.e. all the memory cells 1 where the bit lines BL cross the active word lines AWL can be read in parallel.

FIG. 11 shows a second apparatus according to the invention and rather similar to that in FIG. 10, but now with time-multiplexed connection of bit lines BL to the detection circuitry. The apparatus in FIG. 11 connects a signal sense amplifier circuit 3 with the selected active bit line ABL via an active bit line multiplexer 9 connectable at one end of the bit lines BL. As before, the sense amplifier circuit 3 is clamped to virtual ground and its output is connected with the input of a single lock-in amplifier 4 with a first output for the readout signal and an input for a reference signal from a combined bias voltage and sense signal source 5. The arrangement of the combined bias voltage and signal source 5, an active word line driver 6 and an active word line multiplexer 7 is the same as in the apparatus in FIG. 10 and of course performs the same functions as in the latter. Also, in the apparatus in FIG. 11 the other end of the word lines WL is connected with a passgate bank 8 allowing the inactive word lines WL to be clamped to ground by switching means 8'. However, in the apparatus in FIG. 11 there is at the other end of the bit lines BL additionally provided an inactive bit line passgate bank 10 which similarly uses switching means 10' allowing the inactive bit lines BL to be clamped to the same ground as the inactive word lines.

As can be seen, the apparatus in FIG. 11 implements a full row readout scheme which to a certain degree resembles full row readout schemes for destructive readout described in patent applications belonging to the present applicant. However, it is important to note that contrary to what is the case with destructive readout schemes, full row readout can be done in conjunction with multiplexing, without loss of data. Since readout is non-destructive in the present case, the cells on the bit lines that are not addressed by the switches or routers in a given read cycle retain their logic state. Thus, a complete row of cells can be read by repeated application of full word line excitation, in conjunction with sequential reading in the sense amplifier circuit(s).

It should be obvious to persons skilled in the art that the embodiment of the method and apparatus according to the invention is given by of way of example only and shall in no way be regarded as limiting. It should e.g. be evident that various schemes for implementing the necessary switching, driving and multiplexing functions for performing at least the method according to the invention can be devised by persons skilled in the art, and without imposing any restrictions on the method according to the invention, such that the primary object of the invention, namely the elimination of capacitive couplings in a passive matrix-addressable memory array of capacitor-like structures with a polarizable memory material, in any case will be met when the potential difference across non-addressed cells are brought to zero.

What is claimed is:

1. A method for determining a logic state of selected memory cells provided in a passive matrix-addressable data storage device containing word and bit lines, wherein a specific logic state is assigned a unique logical value according to a predetermined protocol, wherein said cells store data in the form of an electrical polarization state in capacitor-like structures comprising a polarizable material, particularly a ferroelectric or electret material capable of exhibiting hysteresis, wherein said polarizable material is capable of maintaining a non-vanishing electrical polarization in the absence of an externally impressed voltage across said capacitor-like structures, wherein a selection of memory cells takes place by activating the word line or the bit line or both crossing at a memory cell in question, wherein the activation of a word line or a bit line is effected by externally applied potential differences therebetween, thus subjecting said selected cells to a small-signal probing voltage arising from the applied potential difference, whereby a current response is generated from said cells, wherein said small-signal probing voltage is time-dependent in an arbitrarily selectable fashion and has voltage amplitudes and/or durations less than those required for causing significant permanent change in the polarization states of said cells, wherein said logic state is determined by detecting components in said current response from said selected cell, wherein the components of the current response are temporarily correlated with said small-signal probing voltage or referencing signals derived from same, and wherein a decision on a logic state of a selected cell is performed on the basis of a comparison of said current response with a set of predefined criteria, characterized by applying time-dependent potentials on selected word and bit lines or groups, of word and bit lines, said time-dependent potentials being mutually coordinated in magnitude and time such that the resulting voltages across all or some of the non-addressed cells at the crossing points between inactive word lines and an active bit line or active bit lines and/or between inactive bit lines and at least one active word line are brought to contain only negligible voltage components that are temporally correlated with said small-signal probing voltage or referencing signals derived from the same.

2. A method according to claim 1, characterized by activating a single word line at a time.

3. A method according to claim 1, characterized by subjecting inactive word and/or bit lines to potentials that dynamically track with high fidelity and in real time the voltages applied to the active bit and/or word lines, respectively.

4. A method according to claim 3, characterized by controlling the potentials on inactive word lines by dedicated signal sources that derive a signal from an active bit line or active bit lines to dynamically track the potential on said active bit line or bit lines.

5. A method according to claim 3, characterized by controlling the potentials on inactive bit lines by dedicated signal sources that derive a signal from an active word line to dynamically track the potential on said active word line.

6. A method according to claim 3, characterized by controlling the potentials on inactive word lines by electrically latching the same via switches and wiring to the potential on an active bit line or active bit lines.

7. A method according to claim 3, characterized by controlling the potentials on inactive bit lines by electrically latching the same via switches and wiring to the potential on an active word line.

8. A method according to claims 1, characterized by employing an active electronic circuit connected to each active bit line which maintains the potential on an active bit line at a predefined value.

9. A method according to claims 8, characterized by selecting said predefined value as a system ground potential.

10. A method according to claim 8, characterized by all bit lines being active bit lines.

11. A method according to claim 8, characterized by providing a multiplexer or passgate bank to connect one active bit line at a time to an active electronic circuit which maintains the potential on said one active bit line at the predefined value.

12. A method according to claim 8, characterized by providing a multiplexer or passgate bank to connect a selected set of active bit lines at a time to a set of active electronic circuits which maintain the potential on the active bit lines at the predefined value.

13. A method according to claim 8,
characterized by an active electronic circuit providing information on the charge or current flowing into said active bit line.

14. A method according to claim 1,
characterized by latching inactive word lines to system ground potential via a bank of passgates or switches.

15. A method according to claim 1,
characterized by latching inactive bit lines to system ground potential via a bank of passgates or switches.

16. A method according to claim 1,
characterized by providing a multiplexer or passgate bank to connect one active word line at a time to an electronic circuit which controls the potential on said one active word line according to a predefined protocol.

17. A method according to claim 16,
characterized by said potential on said one active word line including a superposition of a small-signal probing voltage and a background biasing voltage.

18. A method according to claim 1,
characterized by analyzing a current response from selected memory cells with a boxcar method, said boxcar method employing timing signals derived from the circuits controlling the potentials on an active word line and/or an active bit line or active bit lines.

19. A method according to claim 1,
characterized by analyzing the current response from selected memory cells with a lock-in method, said lock-in method employing one or more reference signals in the frequency domain derived from circuits controlling the potentials on said active word line and/or said active bit lines.

20. A method according to claim 19,
characterized by performing said analysis with a reference signal derived from a probing voltage component of the voltage applied across said selected memory cells.

21. A method according to claim 19,
characterized by performing said analysis with a reference signal derived from a biasing voltage component of the voltage applied across said selected memory cells.

22. A method according to claim 19,
characterized by performing said analysis with dual reference signals, one reference signal being derived from a probing voltage component and one from a biasing voltage component of the voltage applied across said selected memory cells.

23. A method according to claim 19,
characterized by performing said analysis of the current response using dominant frequency components of at least one of the following, viz. the fundamental or higher harmonics ($2^{nd}$, $3^{rd}$ ...) of a probing voltage in the case where said probing voltage contains a single dominant frequency, or the fundamental or higher harmonics ($2^{nd}$, $3^{rd}$ ...) of one or more components of said probing voltage, where said components contain two or more separate dominant frequencies, or sum or difference frequencies generated by adding and/or subtracting said two or more dominant frequencies.

24. An apparatus for performing the method according to claim 1, wherein the apparatus is connected with and forms part of a ferroelectric memory device with memory cells in a passive addressable matrix with a first electrode set forming word lines (WL) of the memory device and a second set of electrodes forming bit lines (BL) thereof, said apparatus being characterized in comprising respective sense amplifier circuits (3) provided for each bit line (BL) and connected therewith and clamped to virtual ground, a respective lock-in amplifier (4) connected with the output of each sense amplifier circuit (3), and having an input for a reference signal and an output for a readout signal, a combined bias voltage and signal source (5) having an output connected with the reference signal input of the lock-in amplifier (4) for providing a reference signal thereto, an active word line driver (6) connected with another output of the combined bias voltage and signal source (5), said active word line driver (2) having an output connected with a multiplexer (7) for selecting an active word line and being provided connectable at one end of the word lines (WL), and a passgate bank (8) provided at the other end of the word lines (WL) for clamping all inactive word lines (IWL) to ground, whereby the apparatus allows parallel readout of all memory cells on an active word line (AWL).

25. An apparatus for performing the method according to claim 1, wherein the apparatus is connected with and forms part of a ferroelectric memory device with memory cells in a passive addressable matrix with a first electrode set forming the word lines (WL) of the memory device and a second set of electrodes forming the bit lines (BL) thereof, and wherein the apparatus is
characterized in comprising a multiplexer (9) connected at one end of the bit lines (BL), a sense amplifier circuit (3) connected with the bit line multiplexer (9) and clamped to virtual ground, a lock-in amplifier (4) connected with the output of the sense amplifier circuit (3) and having an input for a reference signal and an output for a readout signal, said bit line multiplexer (9) providing the selection of an active bit line (ABL) for readout, a combined bias voltage and signal source (5) having an output connected with the reference signal input of the lock-in amplifier (4) for providing a reference signal thereto, an active word line driver (6) connected with another output of the combined bias voltage and signal source (3), said active word line driver having an output connected with a multiplexer (7) for selecting an active word line (AWL) and being provided connectable at one end of the word lines (WL), a first passgate bank (8) provided at the other end of the word lines (WL) for clamping all inactive word lines (IWL) to ground, a second passgate bank (10) provided connectable to the other end of the bit lines (BL) for clamping all inactive bit lines (IBL) to ground, whereby all memory cells on an active word line (AWL) can be addressed in parallel combined with a sequential readout of the sense amplifier circuit (3) according to a suitable timing protocol.

* * * * *